United States Patent [19]
Park et al.

[11] Patent Number: 5,346,846
[45] Date of Patent: Sep. 13, 1994

[54] METHOD OF MANUFACTURING A HIGHLY INTEGRATED SEMICONDUCTOR DEVICE

[75] Inventors: Young J. Park, Kyoungki; Ha J. Jeon, Seoul, both of Rep. of Korea

[73] Assignee: Hyundai Electronics Industries Co. Ltd., Rep. of Korea

[21] Appl. No.: 84,760

[22] Filed: Jun. 29, 1993

[30] Foreign Application Priority Data

Jun. 30, 1992 [KR] Rep. of Korea ............... 92-11560

[51] Int. Cl.⁵ ............................................... H01L 21/70
[52] U.S. Cl. ........................................ 437/52; 437/47; 437/48; 437/60
[58] Field of Search .................. 437/47, 48, 52, 60, 437/228, 233; 237/309

[56] References Cited

U.S. PATENT DOCUMENTS 5,204,280 4/1993 Dhong et al. ..................... 437/52

*Primary Examiner*—Tom Thomas
*Attorney, Agent, or Firm*—Fish & Richardson

[57] ABSTRACT

This is a method of manufacturing a DRAM cell of a highly integrated semiconductor device increased in the capacity of its capacitor as several cylinder-shaped storage electrodes with first and second polysilicon layers are formed. In order to form several cylinder-shaped electrodes, a polysilicon layer of hemisphere grain structures is used as a mask during the etching process.

6 Claims, 4 Drawing Sheets

METHOD OF MANUFACTURING A HIGHLY INTEGRATED SEMICONDUCTOR DEVICE

BACKGROUND OF THE INVENTION

1. Field of the Invention

This invention relates to a method of manufacturing a highly integrated semiconductor device, and more particularly to a method of manufacturing a Dynamic Random Access Memory(DRAM) cell of a highly integrated semiconductor device with the surface area increased by forming several cylinder-shaped storage electrodes through an etching process employing a polysilicon layer of hemisphere grain structures as a mask.

2. Information Disclosure Statement

Following the conventional manufacturing method of a highly integrated semiconductor device, since a semiconductor device is structurally reduced in the capacity of its capacitor due to high integration, it is absolutely necessary to realize a capacitor having a sufficiently large capacity even if the size of its memory cells is made small.

However, the disadvantages of the conventional method are that the surface area of the storage electrode is reduced as the size of the cells is decreased. Therefore, it is difficult to manufacture a DRAM cell of a highly integrated semiconductor device with a sufficiently large capacity of its capacitor.

SUMMARY OF THE INVENTION

It is therefore an object of the present invention to provide a method of manufacturing a highly integrated semiconductor device self-aligning a contact region of the storage electrode on a silicon substrate and forming several cylinder-shaped storage electrodes in order to increase the capacity of capacitors.

To achieve the above mentioned objective, a field oxide layer is formed on the predetermined part of a silicon substrate and a word line, mask oxide layer, and spacer oxide layer are formed on the silicon substrate and field oxide layer. Thereafter, a first polysilicon layer is deposited and a photoresist pattern with the shape of a window is formed.

After forming an oxide layer over the entire surface, the oxide layer is etched through the etchback process until the photoresist pattern is exposed and then, the photoresist pattern is removed so that a cylinder-shaped oxide layer is formed.

Thereafter, a polysilicon layer of hemisphere grain structures is formed on the surface of the cylinder-shaped oxide layer and first polysilicon layer, and several cylinder-shaped oxide patterns are formed by etching the exposed part of the cylinder-shaped oxide layer through the etching process employing the polysilicon layer of the hemisphere grain structures as a mask and removing the polysilicon layer of the hemisphere grain structures.

Finally, a second polysilicon layer is deposited on the cylinder-shaped oxide patterns and the exposed surface of the first polysilicon layer and the first and second polysilicon layers are etched through the etching process using a mask for forming storage electrodes so that the several cylinder-shaped storage electrodes having the first and second polysilicon layers are formed.

Accordingly, several cylinder-shaped storage electrodes with the large surface area can be formed by using the manufacturing method of a highly integrated semiconductor device according to the present invention.

DETAILED DESCRIPTION OF THE PREFERRED EMBODIMENT

The embodiments of the present invention will be explained in detail by referring to the accompanying drawings.

FIG. 1a through 1f are cross-sectional views that illustrate a manufacturing process of a DRAM cell of a highly integrated semiconductor device according to the first embodiment of the present invention.

Figure 1A:
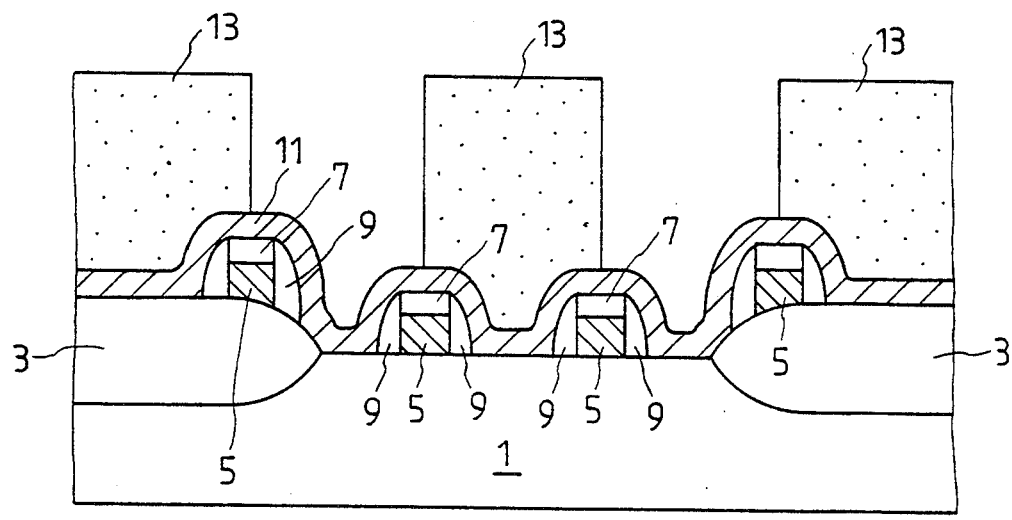
FIG. 1a through FIG. 1f are cross-sectional views illustrating a manufacturing process of a DRAM cell of a highly integrated semiconductor device according to the first embodiment of the present invention.

As shown in FIG. 1a, a field oxide layer 3 is formed on the predetermined part of silicon substrate 1 and a word line 5, a mask oxide layer 7, and a spacer oxide layer 9 are formed on the silicon substrate 1 and field oxide layer 3. Thereafter, a first polysilicon layer 11 is deposited and a first photoresist pattern 13 with the shape of a window is formed.

Figure 1B:
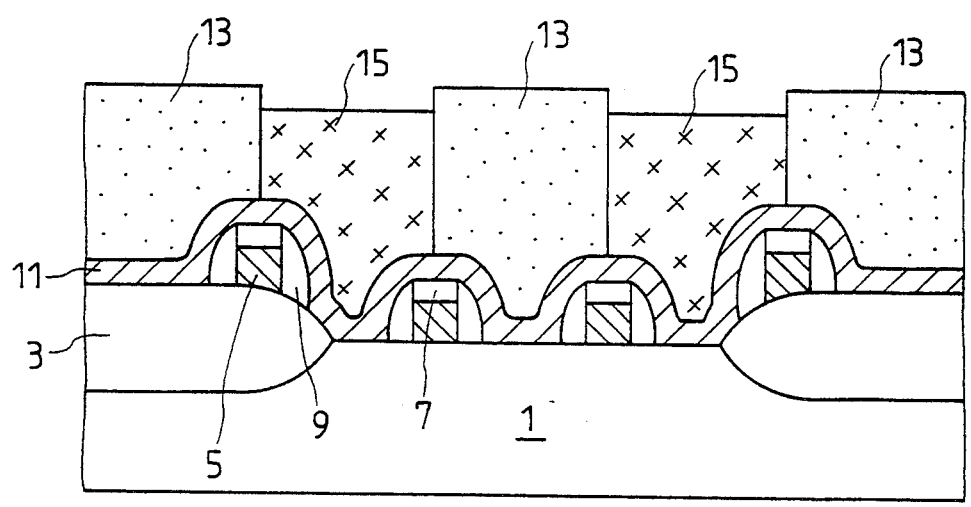

FIG. 1b is a cross-sectional view illustrating the formation of an oxide layer 15, comprising a Spin On Glass (SOG) layer or a Plasma Enhanced Chemical Vapor Deposition (PECVD) layer formed at low temperature. As shown in FIG. 1b, an oxide layer 15 is formed over the entire surface and the oxide layer 15 is etched through the etchback process until the photoresist pattern 13 is exposed.

Figure 1C:
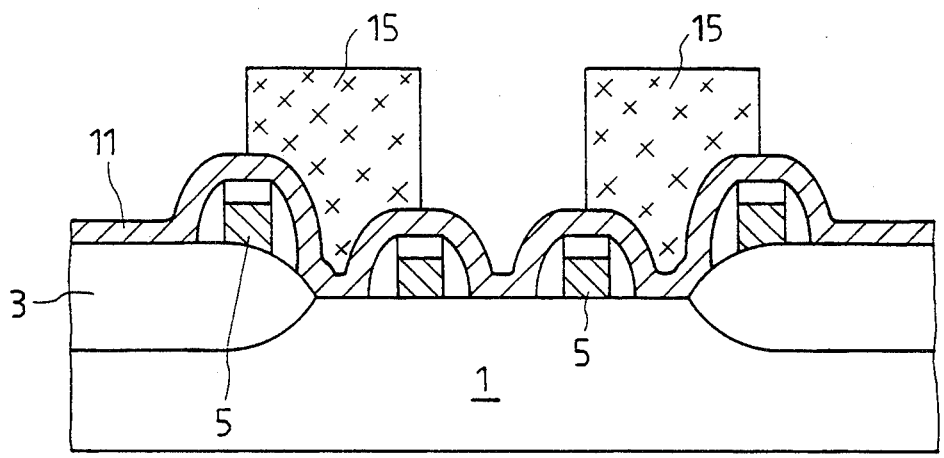

FIG. 1c is a cross-sectional view illustrating the cylinder-shaped oxide layer 15 formed by removing the photoresist pattern 13 after completing the process mentioned in FIG. 1b.

Figure 1D:
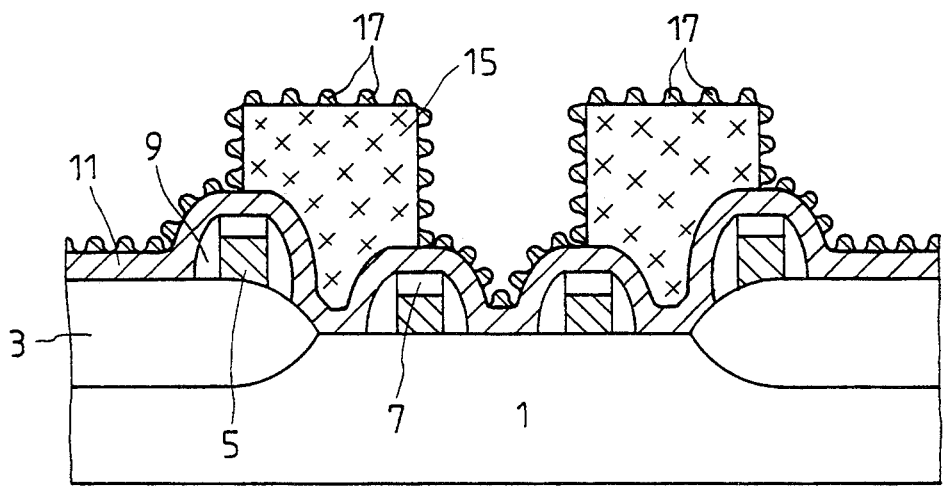

FIG. 1d is a cross-sectional view illustrating a polysilicon layer 17 of hemisphere grain structures on the surface of the cylinder-shaped oxide layer 15 and first polysilicon layer 11 using the well-known manufacturing method.

Figure 1E:
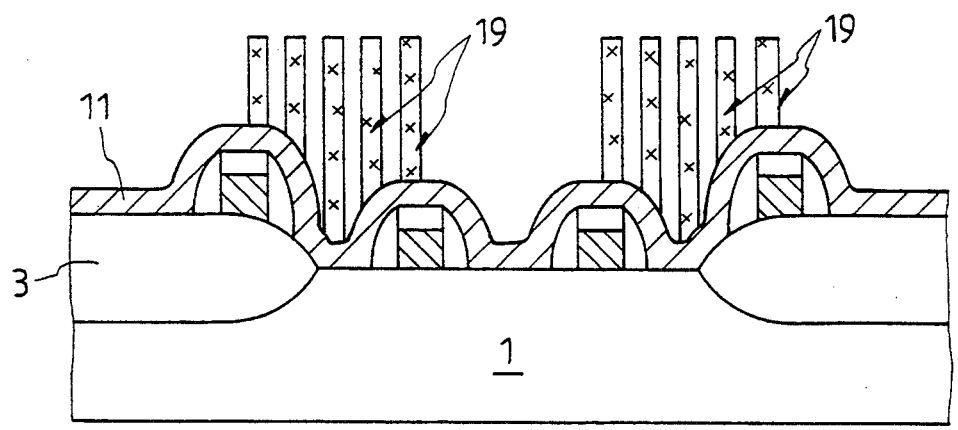

FIG. 1e is a cross-sectional view that illustrates several cylinder-shaped oxide patterns 19 formed by etching the exposed part of the oxide layer 15 through the etching process employing the polysilicon layer 17 of the hemisphere grain structures as a mask and removing the remaining polysilicon layer 17 of the hemisphere grain structures. As shown in FIG. 1e, since the oxide layer 15, on which the polysilicon layer 17 of the hemisphere grain structures is not formed, is exposed, the exposed oxide layer is etched through the etching process. However, the oxide layer 15 on which the polysilicon layer 17 of the hemisphere grain structures is formed is not etched because the polysilicon layer 17 of the hemisphere grain structures prevents the oxide layer 15 from being etched through the etching process in case the etch ratio of the polysilicon layer to the oxide layer is more than 20:1. Therefore, several cylinder-shaped oxide patterns 19 are formed.

Figure 1F:
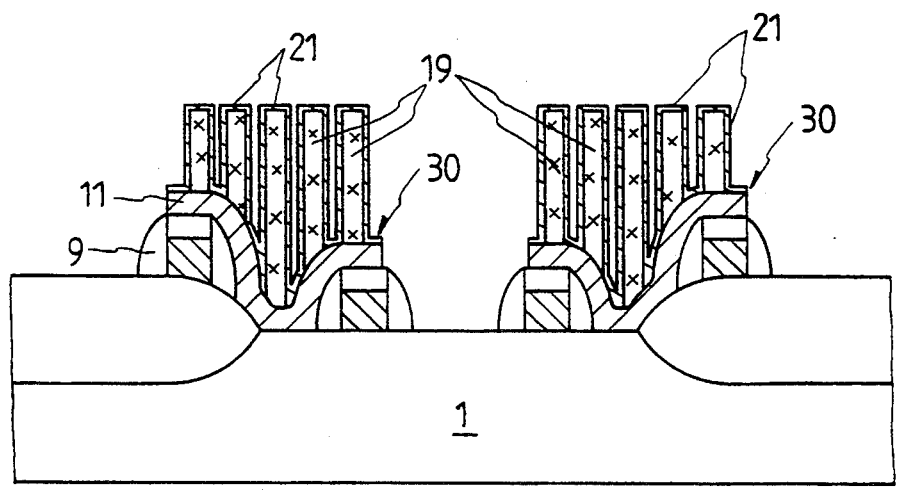

FIG. 1f is a cross-sectional view illustrating the formation of storage electrodes after depositing a second polysilicon layer used for the storage electrode. As shown in FIG. 1f, a second polysilicon 21 is deposited on the cylinder-shaped oxide patterns and exposed surface of the first polysilicon layer, and the first polysilicon layer 11 and second polysilicon layer 21 are etched by the etching process using a mask for forming the storage electrodes so that the storage electrodes 30 having the first polysilicon layer 11 and second polysilicon layer 21, are formed.

Figure 2A:
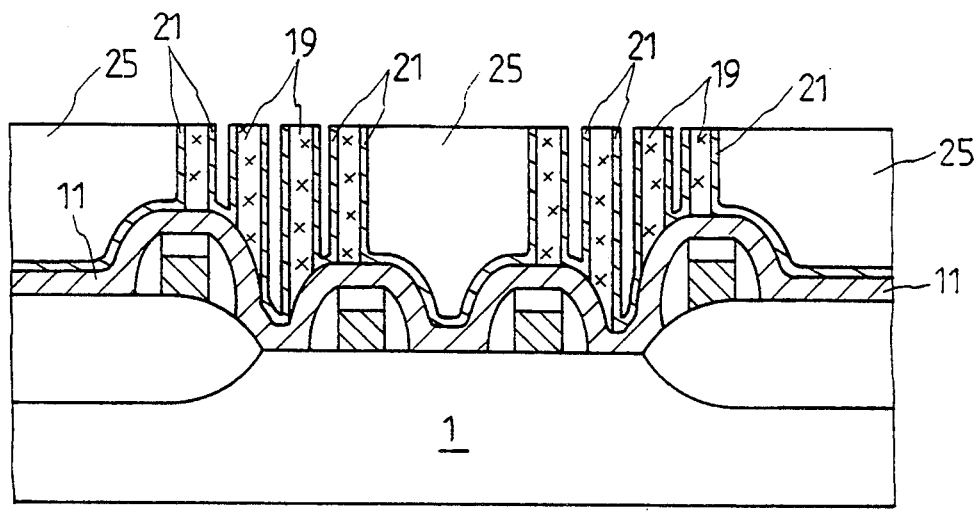
FIG. 2a through FIG. 2b are cross-sectional views illustrating a manufacturing process of a DRAM cell of a highly integrated semiconductor device according to the second embodiment of the present invention.
Figure 2B:
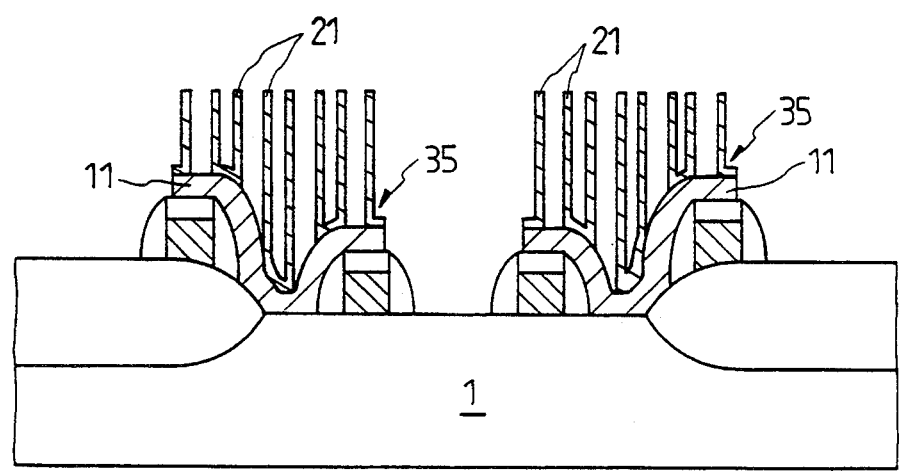

FIG. 2a and FIG. 2b are cross-sectional views that illustrate a manufacturing process of a DRAM cell of a highly integrated semiconductor device according to the second embodiment of the present invention. In the second embodiment, the manufacturing process shown in FIG. 1a through FIG. 1e is carried out in the same manner as the first embodiment of the present invention.

As shown in FIG. 2a, after completing the processes described in FIG. 1e, a second polysilicon layer 21 is deposited on the cylinder-shaped oxide patterns 19 and first polysilicon layer 11, and a photoresist layer 25 is coated on the second polysilicon layer 21. Thereafter, the photoresist layer 25 is etched out by the etchback process until the second polysilicon layer 21 is exposed and then, the exposed second polysilicon layer 21 formed on top of the cylinder-shaped oxide patterns is etched out.

FIG. 2b is a cross-sectional view that illustrates the formation of storage electrodes 35 having the first polysilicon layer 11 and second polysilicon layer 21. As shown in FIG. 2b, the remaining photoresist layer 25 is removed and the cylinder-shaped oxide patterns 19 are etched out. Thereafter, the first polysilicon layer 11 and second polysilicon layer 21 are etched out by the etching process using a mask for forming the storage electrode so that the storage electrodes 35 having the first polysilicon layer 11 and second polysilicon layer 21 are formed. In such case, the surface area of the storage electrodes 35 formed according to the second embodiment of the present invention is larger than that of the storage electrodes 30 formed according to the first embodiment of the present invention.

While the invention has been described with respect to a preferred embodiment thereof, it will be understood by those skilled in the art that various changes in detail may be made therein without departing from the spirit, scope and teaching of the invention.

What is claimed is:

1. A method of manufacturing a highly integrated semiconductor device comprising the steps of:
    forming a field oxide layer on part of a silicon substrate;
    forming a word line, a mask oxide layer, and a spacer oxide layer on said silicon substrate and on said field oxide layer;
    depositing a first polysilicon layer over the entire surface of said semiconductor device;
    forming on said first polysilicon layer a photoresist pattern having a cylinder-shaped window;
    forming a first oxide layer over the entire surface of said semiconductor device;
    etching said first oxide layer through an etchback process until said photoresist pattern is exposed;
    removing the exposed photoresist pattern entirely so that a cylinder-shaped oxide layer remains and a portion of the first polysilicon layer is exposed;
    forming a polysilicon layer of hemisphere grain structures on the surface of said cylinder-shaped oxide layer and on the exposed first polysilicon layer, the hemisphere grain structures of said layer of hemisphere grain structures being separated from each other so as to leave exposed openings on the surface of said cylinder-shaped oxide layer;
    etching the exposed part of said cylinder-shaped oxide layer through the openings formed by said polysilicon layer of the hemisphere grain structures so as to form several cylinder-shaped oxide layer patterns;
    removing said polysilicon layer of the hemisphere grain structures;
    depositing a second polysilicon layer on said cylinder-shaped oxide layer patterns and on the exposed surface of said first polysilicon layer; and
    etching said first polysilicon layer and said second polysilicon layer using a mask for forming a storage electrode made up of said first polysilicon layer and the second polysilicon layer formed on said cylinder-shaped oxide layer patterns.

2. The method of manufacturing a highly integrated semiconductor device of claim 1, wherein said first oxide layer comprises a Spin On Glass layer.

3. The method of manufacturing a highly integrated semiconductor device of claim 1, wherein said first oxide layer comprises a Plasma Enhanced Chemical Vapor Deposition layer.

4. A method of manufacturing a highly integrated semiconductor device comprising the steps of;
    forming a field oxide layer on part of a silicon substrate;
    forming a word line, a mask oxide layer, and a spacer oxide layer on said silicon substrate and on said field oxide layer;
    depositing a first polysilicon layer over the entire surface of said semiconductor device;
    forming on said first polysilicon layer a photoresist pattern having a cylinder-shaped window;
    forming a first oxide layer over the entire surface of said semiconductor device;
    etching said first oxide layer through an etchback process until said photoresist pattern is exposed;
    removing the exposed photoresist pattern entirely so that a cylinder-shaped oxide layer remains and a portion of the first polysilicon layer is exposed;
    forming a polysilicon layer of hemisphere grain structures on the surface of said cylinder-shaped oxide layer and on the exposed first polysilicon layer, the hemisphere grain structures of said layer of hemisphere grain structures being separated from each other so as to leave exposed openings on the surface of said cylinder-shaped oxide layer;
    etching the exposed part of said cylinder-shaped oxide layer through the openings formed by said polysilicon layer of the hemisphere grain structures so as to form several cylinder-shaped oxide layer patterns;
    removing said polysilicon layer of the hemisphere grain structures;
    depositing a second polysilicon layer on said cylinder-shaped oxide layer patterns and the exposed portion of said first polysilicon layer;
    coating a photoresist layer on said second polysilicon layer;
    etching said first polysilicon layer and said second polysilicon layer on top of said cylinder-shaped oxide layer patterns is exposed;
    etching said exposed second polysilicon layer formed on top of said cylinder-shaped oxide layer patterns;
    removing the remaining photoresist layer;

etching away said cylinder-shaped oxide layer patterns; and etching said first polysilicon layer and said second polysilicon layer using a mask for forming a storage electrode made up of said first polysilicon layer and the second polysilicon layer formed on said cylinder-shaped oxide layer patterns.

5. The method of manufacturing a highly integrated semiconductor device of claim 4, wherein said first oxide layer comprises a Spin On Glass layer.

6. The method of manufacturing a highly integrated semiconductor device of claim 4, wherein said first oxide layer comprises a Plasma Enhanced Chemical Vapor Deposition layer.

* * * * *